(12) United States Patent
Chang

(10) Patent No.: US 6,916,690 B2
(45) Date of Patent: Jul. 12, 2005

(54) METHOD OF FABRICATING POLYSILICON FILM

(75) Inventor: Mao-Yi Chang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/605,793

(22) Filed: Oct. 28, 2003

(65) Prior Publication Data

US 2005/0019990 A1 Jan. 27, 2005

(30) Foreign Application Priority Data

Jul. 24, 2003 (TW) .......................... 92120192 A

(51) Int. Cl.[7] .............................................. H01L 21/00
(52) U.S. Cl. ..................................................... 438/149
(58) Field of Search ................................ 438/689, 626, 438/486, 301, 166, 149, 122, 110, 107, 151; 257/758, 619, 506, 353, 72, 59

(56) References Cited

U.S. PATENT DOCUMENTS

2002/0034863 A1 * 3/2002 Yamazaki et al. .......... 438/486

FOREIGN PATENT DOCUMENTS

TW                452892              9/2001

* cited by examiner

*Primary Examiner*—Craig A. Thompson
*Assistant Examiner*—Monica D. Harrison
(74) *Attorney, Agent, or Firm*—Jianq Chyun IP office

(57) ABSTRACT

A method of fabricating polysilicon film is described. An amorphous silicon layer is formed on the substrate, an optical layer is formed on the amorphous silicon layer, wherein the optical has a first region having a first thickness and a second region having a second thickness, and the reflectivity of the first region for an excimer laser is higher than that of the second region. A laser annealing process is then preformed to transform the amorphous silicon layer into a polysilicon film.

10 Claims, 7 Drawing Sheets

METHOD OF FABRICATING POLYSILICON FILM

CROSS REFERENCE TO RELATED APPLICATIONS

This application claims the priority benefit of Taiwan application serial no. 92120192, filed on Jul. 24, 2003.

BACKGROUND OF INVENTION

1. Field of the Invention

The present invention relates to a method of forming a polysilicon film, and more particularly, to a method of forming a polysilicon film of thin film transistors of thin film transistor liquid crystal display (TFT-LCD).

2. Description of the Related Art

Generally, an active matrix liquid crystal display may be classified based on material used for fabricating thin film transistors, namely a polysilicon thin film transistor display and an amorphous silicon thin film transistor display. Because the polysilicon thin film transistor can integrate driving circuits, it can provide a higher yield and fabrication cost thereof is lower than the amorphous silicon thin film transistor. In addition, a polysilicon film can provide better electrical characteristics than an amorphous silicon layer, and can be used on a glass substrate to fabricate electronic devices. Another advantage of the polysilicon film transistor technology is its higher resolution capability so that the size of the devices fabricated using the polysilicon film transistor technology can be substantially reduced. General mass-produced polysilicon thin film transistor displays can be fabricated by utilizing low temperature fabricating technology (at a range of about 450° C. to 550° C.), for example, a low temperature thin film process for forming a high quality gate dielectric layer and ion implantation process for large size substrates.

Because of cost concern of glass substrates, a solid phase crystallization (SPC) process is applied for forming a thin film under low temperature. However, the process temperature of about 600° C. is too high and therefore adversely affecting crystallization of the thin film. Alternatively an excimer laser is applied in an excimer laser crystallization (ELC) process or excimer laser annealing (ELA) process for low-temperature thin film crystallization, wherein the laser scans and melt an amorphous silicon layer in order to crystallize and transform an amorphous silicon into a polysilicon film.

FIGS. 1A and 1B illustrates a sectional view illustrating a fabrication process of forming a polysilicon film in accordance with a prior art.

Referring to FIG. 1A, a substrate 100 is provided. An insulation layer 102 and an amorphous silicon layer 104 are sequentially formed on the substrate 100. A patterned anti-reflective layer 106 comprised of a silicon nitride layer is formed the amorphous silicon layer 104, and thereby defining a non-exposure region 130 (covered by the anti-reflective layer 106) and an exposure region 140 (not covered by the anti-reflective layer 106).

An excimer laser 108 having sufficient energy is then applied to the structure mentioned above. Because the anti-reflective layer 106 has a capability of enhancing the exposing efficiency of the excimer laser 108, and therefore the temperature of the amorphous silicon layer 104a in the non-exposure region 130 is higher than that of the amorphous silicon layer 104b in the exposure region 140. Therefore, the amorphous silicon layer 104a in the non-exposure region 130 is completely melted and the amorphous silicon layer 104b in the exposed region 140 is partially or incompletely melted.

Referring to FIG. 1B, the unmelted amorphous silicon layer 104b then serves as a nucleation site/discrete seed for re-crystallization. Therefore, the crystallization of the polysilicon layer is performed from the amorphous silicon layer 104b laterally towards the amorphous silicon layer 104a, i.e. the direction of arrow 110, thereby forming a polysilicon layer 112a and a polysilicon layer 112b.

FIGS. 2A and 2B illustrates another fabrication process of forming a polysilicon film of a prior art.

Referring to FIG. 2A, a substrate 200 is provided. An insulation layer 202 and an amorphous silicon layer 204 are sequentially formed on the substrate 200. A patterned silicon nitride layer 206 is formed on the amorphous silicon layer 204 covering a portion 240a of the amorphous silicon layer 204 defining a non-exposure region 230. A portion 204b not covered by the amorphous silicon layer 204 remain exposed is defined as an exposure region 240. The silicon nitride 206 serves as a heat sink.

An excimer laser 208 is then applied to the above structure. Because the heat sink 206 is capable of reflecting the excimer laser 208, while the portion 204b of the amorphous silicon layer 204 in the exposure region 240 is exposed to the excimer laser 208, and therefore the temperature of the excimer laser is absorbed by the exposed portion 204b of the amorphous silicon layer 204. Thus, the temperature of the exposed portion 204b of the amorphous silicon layer 204 in the exposed region 240 is higher than that of the portion 204a of the amorphous silicon layer 204 in the non-exposure region 230. Therefore, the portion 204b of the amorphous silicon layer 204 in the non-exposure region 230 is substantially melted while the portion 204a of the amorphous silicon layer 204 in the non-exposure region 230 is partially or incompletely melted.

Referring to FIG. 2B, the un-melted portion of the portion 204a of the amorphous silicon layer 204 serves as a nucleation site/discrete seed for crystallization process. Therefore, the polysilicon layer 212a, 212b, is formed by crystallization of the portion 204a of the amorphous silicon layer 204 which occurs along a lateral direction starting from the portion 204a of the amorphous silicon layer 204 towards the portion 204b of the amorphous silicon layer 204. That is, along the direction of arrow 210 as shown in FIG. 2B.

It is to be understood that in both of the methods mentioned above, the temperature differences between the portions 104a/104b, 204a/204b of the amorphous silicon layer 104/204 vary and are limiting factors, and accordingly, the grain size of the crystallization will be affected and limited therefrom.

SUMMARY OF INVENTION

Accordingly, in the light of the foregoing, one object of the present invention is to provide a method of forming polysilicon film, which method is capable of increasing the lateral temperature gradient between portions of the amorphous silicon layer in order to induce lateral crystallization of polysilicon grains. Therefore a polysilicon film having larger grain size can be formed.

Another object of the invention is to provide a method of forming polysilicon film, which method is capable of increasing the lateral temperature gradient between prescribed regions of the amorphous silicon layer in order to induce crystallization of amorphous silicon layer at specific locations to increase the silicon grain size. Therefore, prescribed regions having larger silicon grain size can be formed.

In accordance with the above objects and other advantages, as broadly embodied and described herein, the present invention provides a method of forming polysilicon film comprising the steps of: forming an amorphous silicon layer on a substrate; forming a first optical layer on the amorphous silicon layer, wherein the first optical layer is comprised of a first region with a first thickness and a second region with a second thickness, and a reflectivity of the first region is higher than a reflectivity of the second region; performing a laser annealing process wherein a temperature of the amorphous silicon layer beneath the first region is lower than that of the amorphous silicon layer beneath the second region so that the amorphous layer beneath the first region is partially or not completely melted and the amorphous silicon, layer beneath the second region is substantially or completely melted; and crystallizing the melted silicon layer. Because of the differential lateral temperature gradient, the melted amorphous silicon layer can laterally crystallize by using the partially or incompletely melted amorphous silicon layer as a nucleation site/discrete seed to form a polysilicon film.

According to one aspect of the present invention, an optical layer having differential thickness with differential reflectivity is formed on an amorphous silicon layer so that the corresponding portions of the amorphous silicon layer can be subjected to differential annealing temperatures to induce lateral crystallization of the amorphous silicon layer.

Further, the physical profile, such as thickness can be accordingly tailored to provide desired degree of light reflectivity to achieve desired lateral differential temperature gradient. Therefore, the method of the present invention is capable of precisely controlling the lateral differential temperature gradient between prescribed regions of the amorphous silicon layer in order to induce crystallization of amorphous silicon layer at specific locations and to increase the silicon grain size. Therefore, a polysilicon film comprising a uniform and larger silicon grains in prescribed regions can be formed.

DETAILED DESCRIPTION

FIGS. 3A–3E are cross-sectional views illustrating a method of forming a polysilicon film according to a preferred embodiment of the present invention.

Figure 1A:
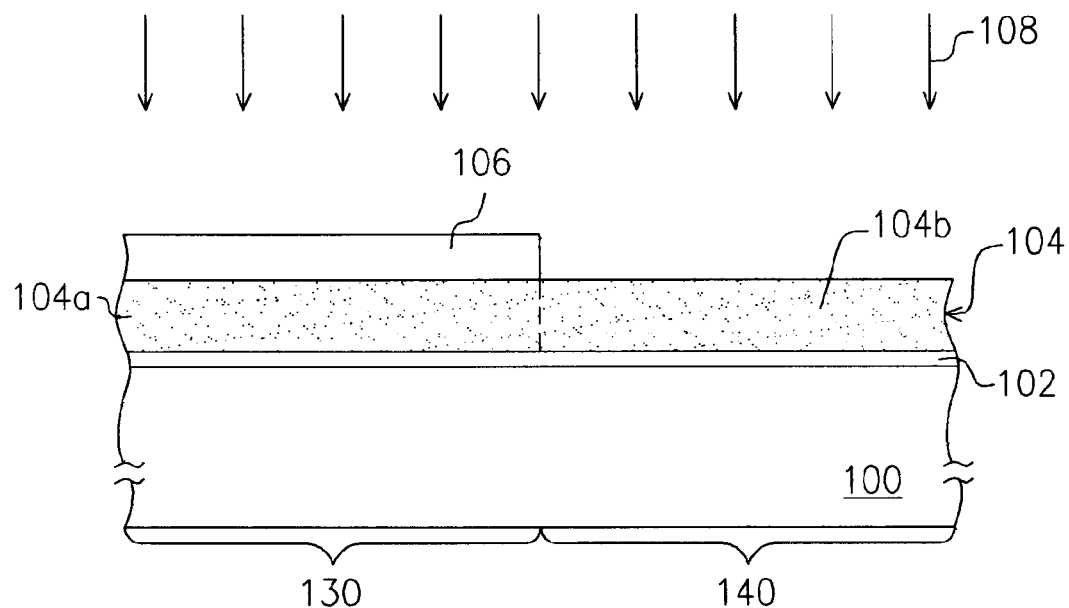
FIGS. 1A and 1B illustrates a conventional fabrication process of forming a polysilicon film.
Figure 1B:
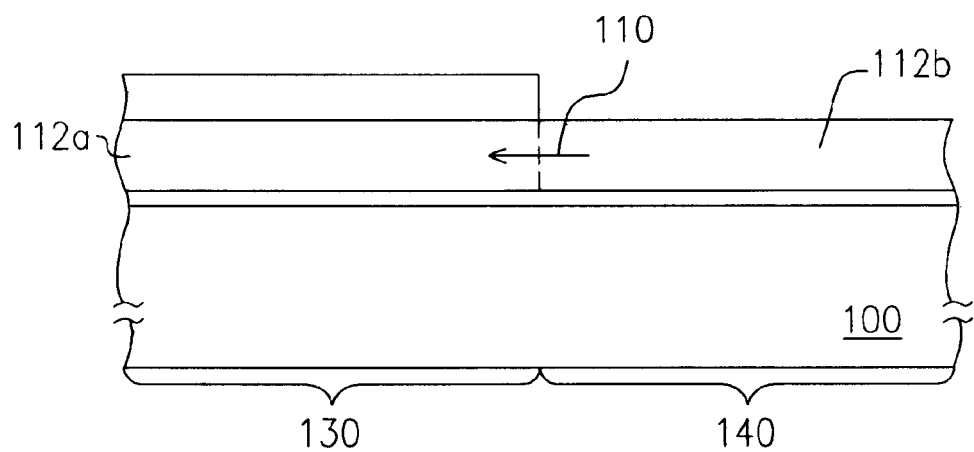
Figure 2A:
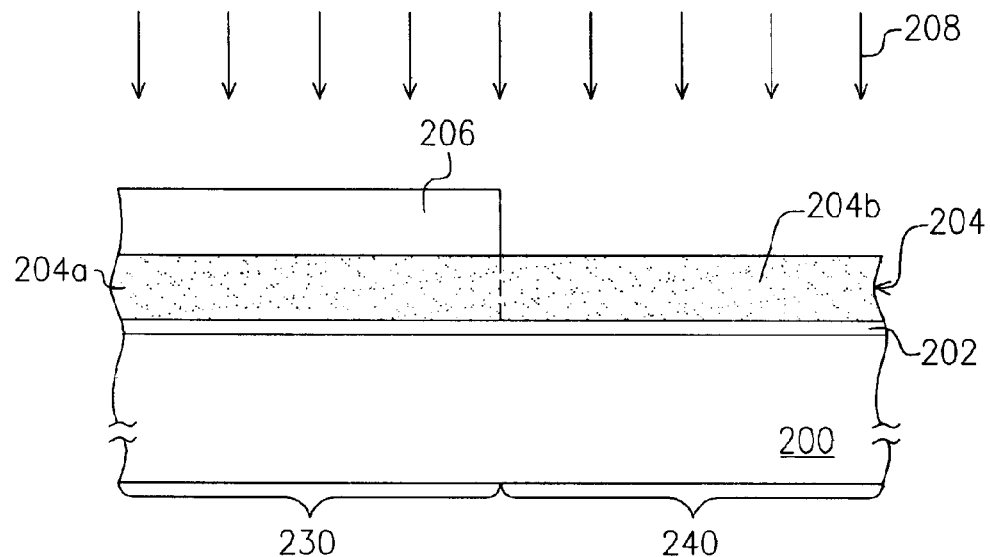
FIGS. 2A and 2B illustrates another conventional fabrication process of forming a polysilicon film.
Figure 2B:
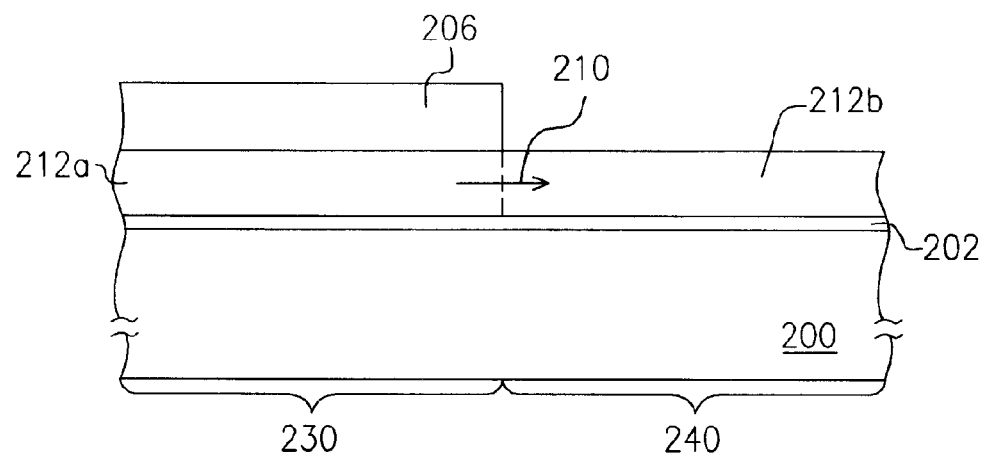
Figure 3A:
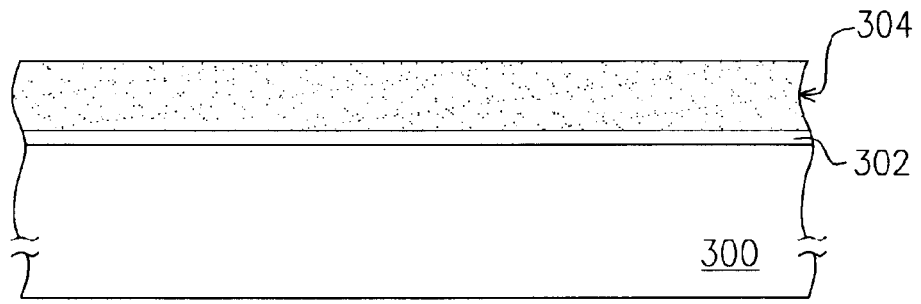
FIGS. 3A–3E are cross-sectional views illustrating a method of forming a polysilicon film according to a preferred embodiment of the present invention.

Referring to FIG. 3A, a substrate 300 is provided. The substrate 300 is comprised of, for example, a silicon wafer, a glass substrate or a plastic substrate. An insulation layer 302 is formed on the substrate 300. Preferably, the material of the insulation layer 302 is comprised of, for example, silicon dioxide, and can be formed by performing, for example, a low pressure chemical vapor deposition (LPCVD) process, a plasma enhanced chemical vapor deposition (PECVD) process or a sputtering process. The insulation layer has a thickness of, for example, about 500~4000 Å. An amorphous silicon layer 304 is then formed on the insulation layer 302, and the amorphous silicon layer 304 can be formed by performing, for example, a LPCVD, a PECVD or a sputtering process. The amorphous silicon layer 304 has a thickness of, for example, about 200~3000 Å.

Figure 3B:
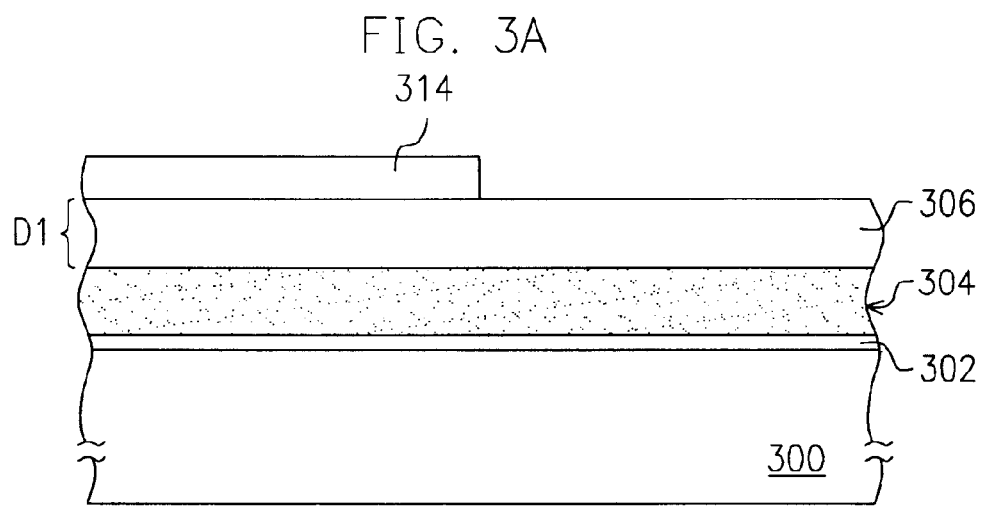

Next, referring to FIG. 3B, an optical layer 306 is formed on the amorphous silicon layer 304, wherein the degree reflectivity of the optical layer 306 is a function of the thickness thereof. Preferably, the material of the optical layer 306 is comprised a high thermal conductive material such as a silicon nitride. Preferably, the optical layer 306 can be formed by performing, for example, a CVD process using a reaction gas mixture comprising silicon silane ($SiH_4$) and ammonia ($NH_3$). In addition, the optical layer 306 has a thickness D1, which is, for example, from about 10 nm to about 2 µm. The thickness D1, for example, offer the optical layer 306 a maximum reflectivity, and the material of the optical layer 306 is adapted for serving as a heat sink layer in the subsequent laser annealing process. A patterned mask layer 314 is then formed on the optical layer 306, wherein the material of the patterned mask layer 314 can be, for example, a photoresist. Preferably, the patterned mask layer 314 can be formed by performing, for example, spin-coating a photoresist layer over the optical layer 306, exposing and then developing the photoresist layer.

Figure 3C:
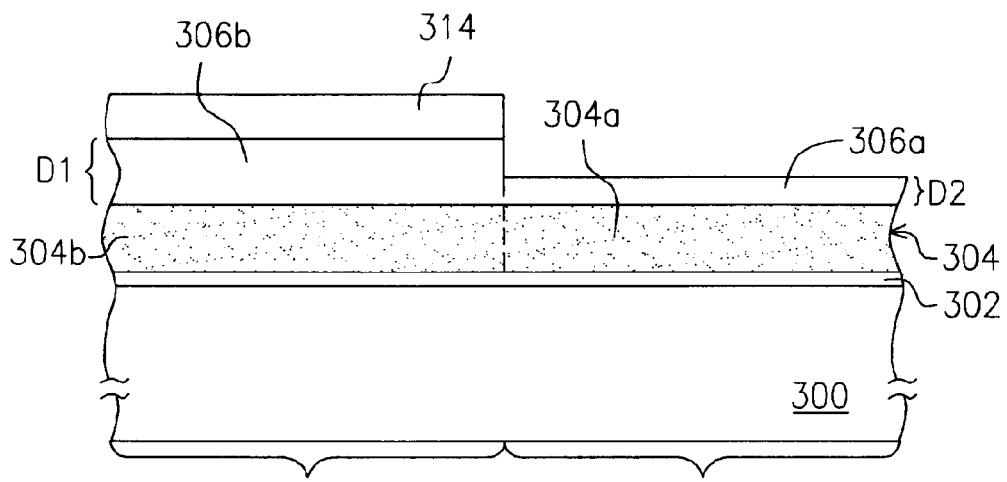

Next, referring to FIG. 3C, by using the patterned mask layer 314 as an mask, a portion of the optical layer 306 is removed until a pre-determined thickness D2 is reached, wherein the step of removing the portion of the optical layer 306 comprises performing, for example, an anisotropic etch process. In addition, the thickness D2 of the optical layer 306a can be, for example, sufficient for the optical layer 306a to have a minimum reflectivity, and the optical layer 306a is adapted for serving as an anti-reflective layer in the subsequent laser annealing process.

Therefore, by removing the portion of the optical layer 306, the heat sink layer 306b having a thickness D1 and the anti-reflective layer 306a having a thickness D2 are formed within the optical layer 306. Moreover, an amorphous silicon layer 304b of a heat sink region 430 and an amorphous silicon layer 304a of an anti-reflective region 440 are formed within the amorphous silicon layer 304.

Figure 3D:
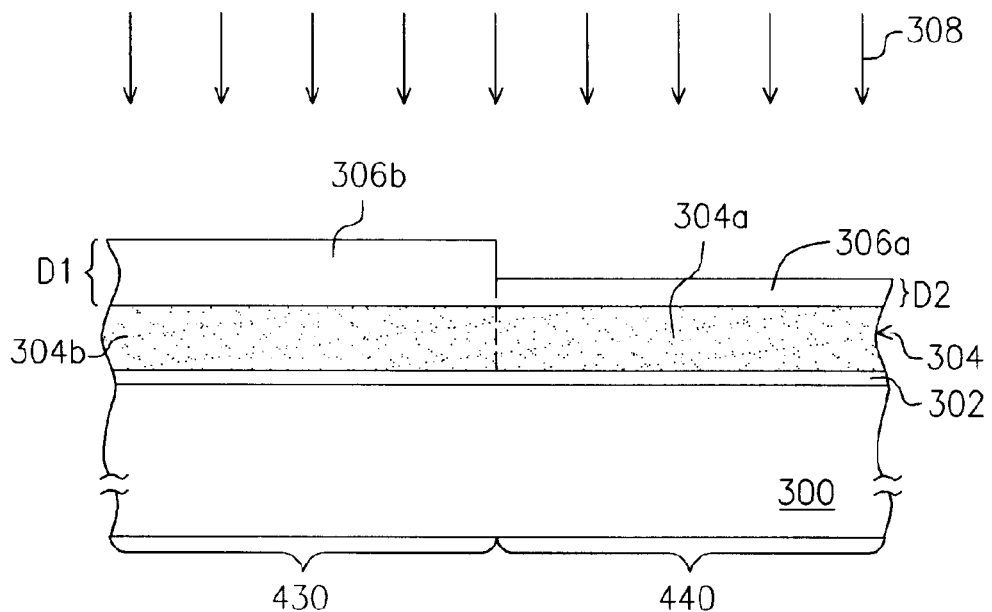

Next, referring to FIG. 3D, the patterned mask layer 314 is removed and then the resulting structure is subjected to a laser annealing process 308. Preferably, the laser annealing process 308 comprises, for example, an excimer laser annealing. The amorphous silicon layer 304a underneath the anti-reflective region 440 is substantially or completely melted, and the amorphous silicon layer 304b underneath the heat sink region 430 is partially melted.

During the laser annealing process 308, the anti-reflective layer 306a in the heat sink region 430 and the heat sink layer 306b an the anti-reflective region 440 are formed with different thickness on the amorphous silicon layer 304, and therefore a differential temperature gradient exists between the amorphous silicon layer 304a beneath the anti-reflective region 440 and the amorphous silicon layer 304b beneath the heat sink region 430 to induce lateral crystallization of the amorphous silicon layer 304. It is to be noted that the degree of the differential temperature gradient can be controlled by tailoring the thickness of anti-reflective layer 306a and the heat sink layer 306b to achieve desired lateral crystallization of the amorphous silicon layer 304 to form a polysilicon film.

Figure 3E:
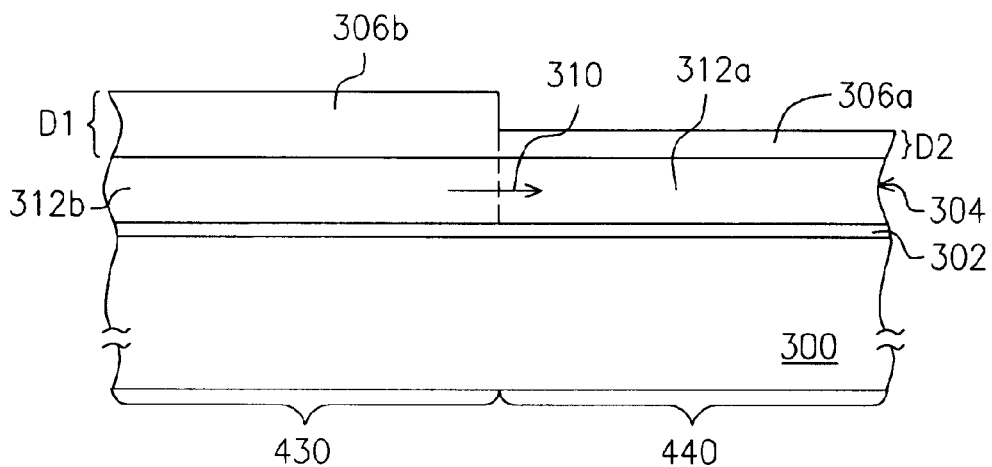

Finally, as shown in FIG. 3E, the amorphous silicon layer is transformed into a polysilicon films 312a and 312b through lateral crystallization of the amorphous silicon layers 304a and 304b, wherein the un-melted portion of the amorphous silicon layer 304b serves as a nucleation site/ discrete seed. The arrow 310 represents the lateral direction of crystallization, wherein the amorphous silicon layer 304a is transformed into the polysilicon film 312a, and the amorphous silicon layer 304b is transformed into the polysilicon film 312b. The polysilicon layer 312a has larger silicon grain size and has better electrical properties. Accordingly, by controlling the pattern and location of the optical layer 306, polysilicon films comprising silicon grains with desired grain size can be formed at prescribed locations and along the prescribed crystallization directions.

Figure 4:
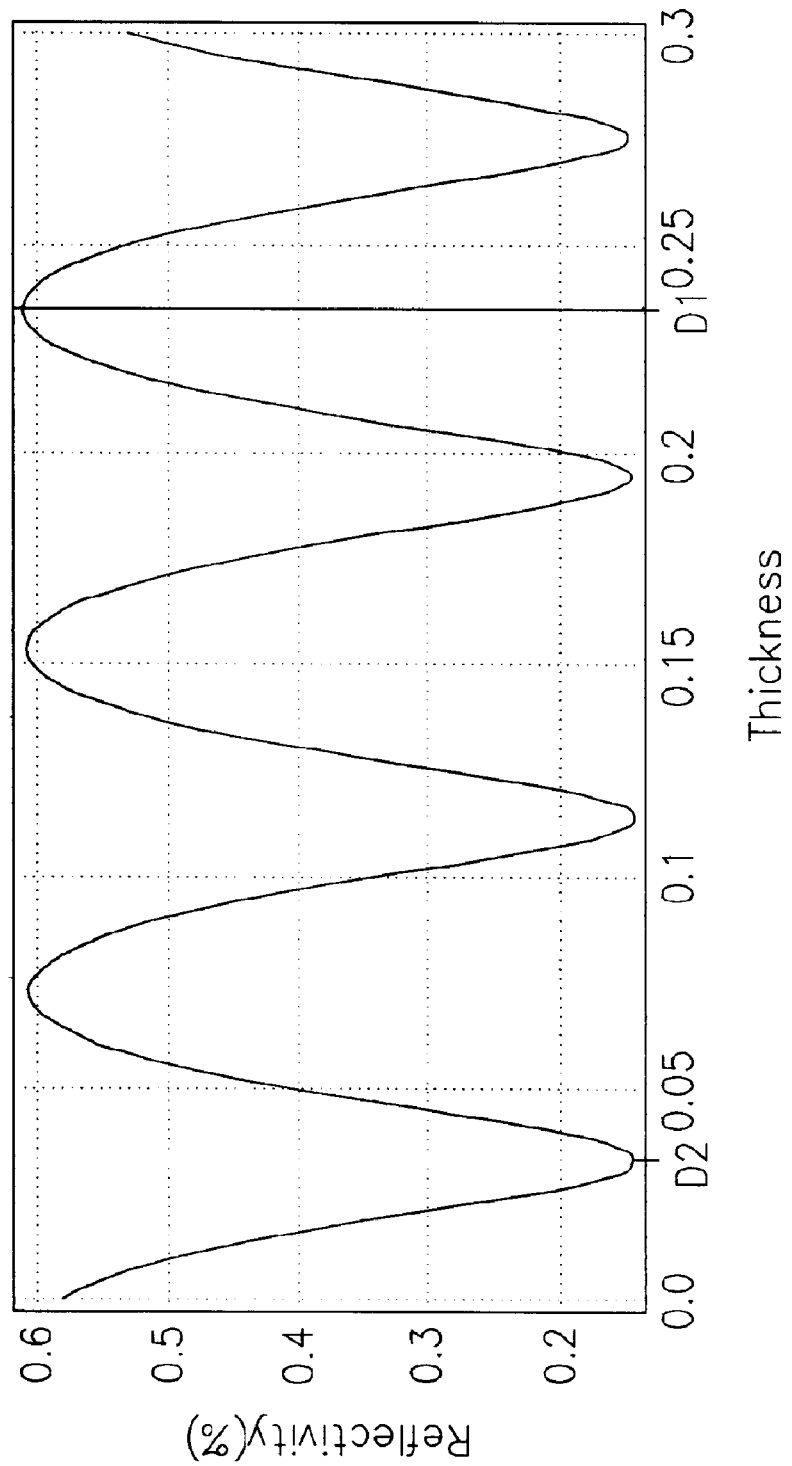
FIG. 4 is a graph showing relationship between thickness and reflectivity of silicon nitride.

Referring to FIG. 4, is a schematic showing a relationship between thickness and reflectivity of silicon nitride. As shown FIG. 4, the reflectivity of silicon nitride for an excimer laser annealing periodically varies with the thickness of silicon nitride. Therefore, as shown in FIG. 4, by forming a layer of silicon nitride with a prescribed thickness at which the silicon nitride layer exhibit maximum reflectivity, reflecting most of the excimer laser, and absorb heat from the amorphous silicon layer formed thereunder. Moreover, by forming a layer of silicon nitride with a prescribed thickness (for example, D2) at which the silicon nitride layer exhibit a minimum reflectivity exposing the amorphous silicon layer formed thereunder to the excimer laser.

In addition, although the preferred embodiment of the present invention utilize a silicon nitride layer as the optical layer, however the present invention is not limited to silicon nitride layer. Accordingly, other material having similar material properties of silicon nitride mentioned above can also be used as the optical layer, for example, silicon oxide, e.g. tetraethylorthosilicate (TEOS) or the other material having good thermal conductive characteristic.

Moreover, although not mentioned in the preferred embodiment, the present invention also includes forming an optional insulation layer between the substrate 300 and the insulation layer 302, comprised or a material different form that of the insulation layer 302 to serve as a protection layer of the substrate 300.

Figure 5:
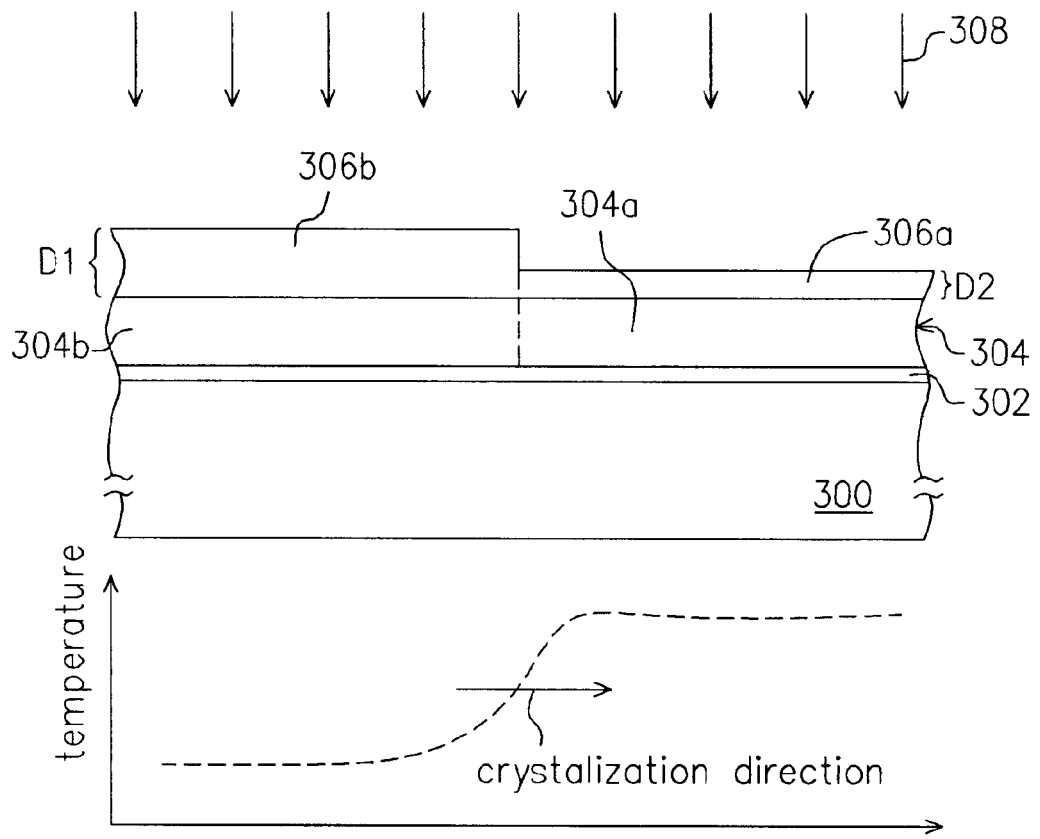
FIG. 5 is a cross sectional view of a thin film transistor and a temperature gradient distribution curve between the incompletely melted region of the amorphous silicon layer beneath the thicker region optical layer and the melted region of the amorphous silicon beneath the thinner region of the optical layer.

Referring to FIG. 5, a temperature gradient distribution curve showing the relationship between the partially or incompletely melted portion of the amorphous silicon layer beneath the heat sink region and the melted portion of the amorphous silicon layer beneath the anti-reflective region. Because the amorphous silicon layer 304b beneath the heat sink layer 306b is only partially melted, a large temperature difference exists between the un-melted portion of the amorphous silicon layer 304b beneath the heat sink layer 306b in the heat sink region and the melted portion of the amorphous silicon layer 304a beneath the anti-reflective layer 306a in the anti-reflective region. Because of the larger temperature difference as shown in the temperature gradient distribution curve, silicon grains with larger grain size can be generated. Further, the polysilicon film can be formed with silicon grains having uniform grains size and thereby substantially improving device performance of thin film transistors. In addition, the lateral differential temperature gradient of the present invention is larger than that in the conventional method, which utilizes either an anti-reflective layer or a heat sink layer. Therefore, the present invention has the capability of enhancing the lateral crystallization of the polysilicon film generating larger silicon grains.

Figure 6:
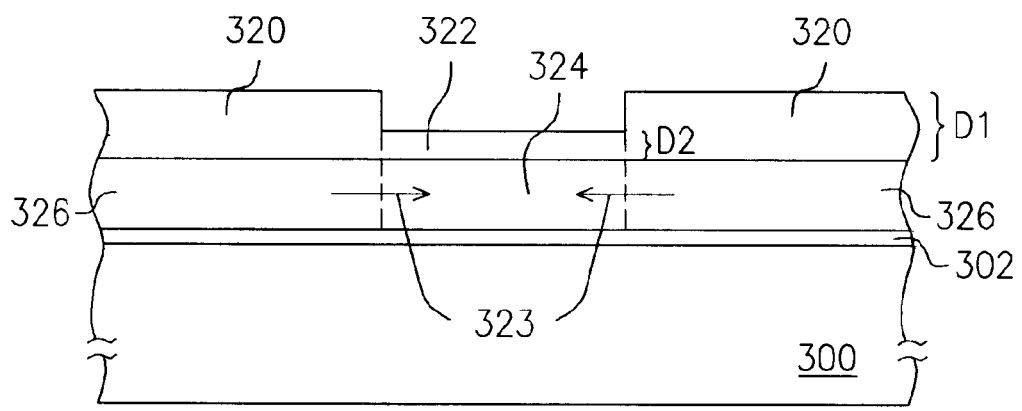
FIG. 6 is a cross sectional view of a thin film transistor showing a schematic configuration of channel layer of the thin film transistor, which is fabricated using the fabrication method of the present invention.

Referring to FIG. 6, a schematic configuration of channel layer of a thin film transistor fabricated from using the method of the present invention is shown. As shown in FIG. 6, when an optical layer 320 having a thinner portion labeled as 322 at a prescribed region that correspond to the anti-reflective region described above sandwiched between two thicker portions 320 on the amorphous silicon layer, and annealed using the excimer laser, the amorphous silicon layer beneath the thicker portions of the optical layer 320 will laterally crystallize toward to the center, that is, along the directions shown by arrows 323. As a result, a polysilicon film 324 beneath the thinner portion 322 of the optical layer is formed with larger silicon grains to serve as a channel layer of the thin film transistor. The polysilicon layers 326 beneath the heat sink layer 320, after being doped with dopants, can serve as source/drain regions. In addition, by arranging the crystallization direction parallel to the direction of current flow, the grain boundaries of the polysilicon layer within the electronic device can be in a direction parallel to the direction of current flow so that the defects due to erratic grain boundaries can be effectively reduced.

Figure 7:
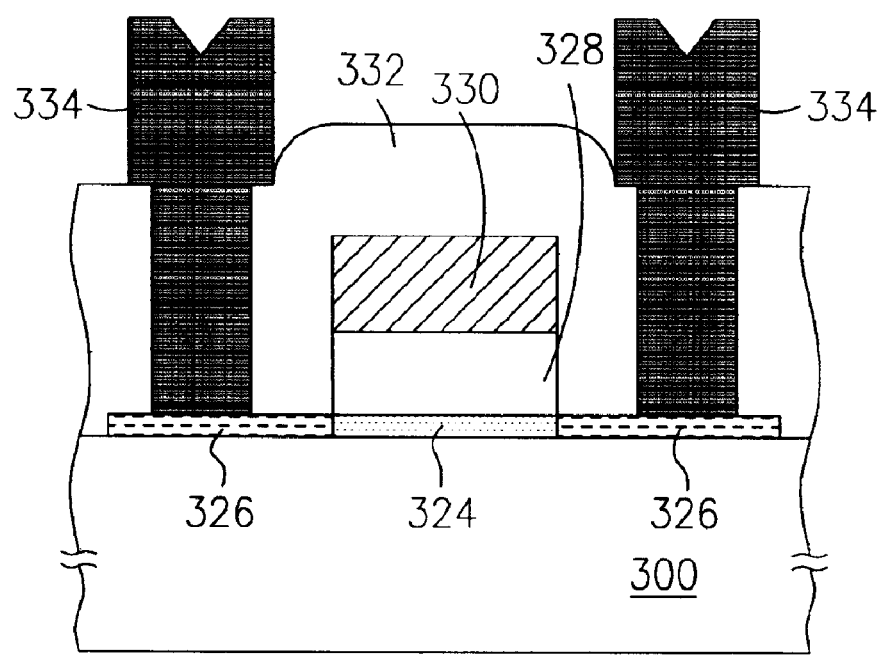
FIG. 7 is a cross sectional view showing a top gate polysilicon thin film transistor formed from the polysilicon film of FIG. 6.

Next, referring to FIG. 7, a cross sectional view of a top gate polysilicon thin film transistor of FIG. 6 is shown. As shown in FIG. 6, an insulation layer 328 is formed on the channel layer 324, i.e. polysilicon layer. Then a gate conductive layer 330 is then formed on the insulation layer 328. After forming the gate conductive layer 330, a dielectric layer 332 is formed over the gate conductive layer 330, fully covering resulting structure including the substrate 300. Finally, source/drain regions, i.e. doped polysilicon layer 326, and contact windows 334 are formed. Thus, the fabrication of a thin film transistor is completed.

As described above, because the present invention provides an optical layer having differential thickness having differential reflectivity formed on an amorphous silicon layer so that the corresponding portions of the amorphous silicon layer can be subjected to differential annealing temperature to induce crystallization of the amorphous silicon layer. Further, the physical profile, such as thickness, can be accordingly tailored to provide desired degree of light reflectivity to achieve desired lateral differential temperature gradient. Therefore, the method or present invention is capable of precisely controlling the lateral differential temperature gradient between prescribed regions of the amorphous silicon layer in order to induce crystallization of amorphous silicon layer at specific locations and to increase the silicon grain size. Therefore, a polysilicon film comprising a uniform and larger silicon grains in prescribed regions can be formed. Therefore the electrical property of the polysilicon film formed by using the method of the present invention can be substantially promoted.

Although the present invention has been described in terms of exemplary embodiments, it is not limited thereto. Rather, the appended claims should be constructed broadly to include other variants and embodiments of the invention, which may be made by those skilled in the field of this art without departing from the scope and range of equivalents of the invention. For example, the optical layer can also be comprised of a multilayer structure, and unlike in the preferred embodiments where only one region defined with thinner optical layer represented by antireflective region is shown, more than one antireflective regions may be utilized to practice the present invention. In addition, an exposure region can also be formed between the so called heat sink region and the anti-reflective region mentioned above to create three differential temperature regions. Accordingly, the scope of the present invention should not be interpreted as limiting the scope of the present invention.

What is claimed is:

1. A method of forming a polysilicon film, comprising:
   providing a substrate;
   forming an amorphous silicon layer over the substrate;
   forming an optical layer on the amorphous silicon layer;
   forming and patterning a mask layer on the optical layer;
   etching the optical layer to form a heat sink layer and an anti-reflective layer, the heat sink layer being substantially thicker than the anti-reflective layer;
   performing a laser annealing to transform at least a portion of the amorphous silicon layer into a molten silicon layer; and
   forming a polysilicon film by crystallizing the molten silicon layer.

2. The method of forming polysilicon film of claim 1, further comprising:
   forming and defining a channel region using the polysilicon film as a channel layer; and
   forming source/drain regions above the heat sink layer adjacent to the channel region.

3. The method of forming a polysilicon film of claim 1, wherein the step of etching the optical material layer is performed by an anisotropic etching process.

4. The method of forming a polysilicon film of claim 1, wherein the optical layer is formed by a thermal conductive material selected from the group consisting of silicon and silicon oxide.

5. The method of forming a polysilicon film of claim 1, further comprising forming an insulation layer between the substrate and the amorphous silicon layer.

6. The method of forming a polysilicon film of claim 1, wherein a reflectivity of the anti-reflective layer is higher than the reflectivity of the heat sink layer.

7. A method of forming a polysilicon film of a thin film transistor, comprising:
   providing a substrate;
   forming an amorphous silicon layer over the substrate;
   forming an optical layer on the amorphous silicon layer;
   forming and patterning a mask layer on the optical layer;
   etching the optical layer to form a heat sink layer and an anti-reflective layer, the heat sink layer being substantially thicker than the anti-reflective layer;
   performing a laser annealing to transform at least a portion of the amorphous silicon layer into a molten silicon layer;
   forming and defining a channel region by crystallizing the molten silicon layer; and
   forming and defining source/drain regions above the heat sink layer adjacent to the channel region.

8. The method of forming a polysilicon film of a thin film transistor as claimed in claim 7, wherein the optical layer is formed by a thermal conductive material selected from the group consisting of silicon nitride and silicon oxide.

9. The method of forming a polysilicon film of a thin film transistor as claimed in claim 7, further comprising forming an insulation layer between the substrate and the amorphous silicon layer.

10. The method of forming a polysilicon film of a thin film transistor as claimed in claim 7, wherein a reflectivity of the anti-reflective layer is higher than the reflectivity of the heat sink layer.

* * * * *